(12) United States Patent
Wallace et al.

(10) Patent No.: US 10,062,548 B2
(45) Date of Patent: Aug. 28, 2018

(54) GAS INJECTION SYSTEM FOR ION BEAM DEVICE

(71) Applicant: Varian Semiconductor Equipment Associates, Inc., Gloucester, MA (US)

(72) Inventors: Jay Wallace, Danvers, MA (US); Ernest Allen, Rockport, MA (US); Richard Hertel, Boxford, MA (US); Kevin Daniels, Lynnfield, MA (US); Glen Gilchrist, Danvers, MA (US)

(73) Assignee: VARIAN SEMICONDUCTOR EQUIPMENT ASSOCIATES, INC., Gloucester, MA (US)

( * ) Notice: Subject to any disclaimer, the term of this patent is extended or adjusted under 35 U.S.C. 154(b) by 96 days.

(21) Appl. No.: 14/840,531

(22) Filed: Aug. 31, 2015

(65) Prior Publication Data

US 2017/0062185 A1 Mar. 2, 2017

(51) Int. Cl.
*H01J 37/32* (2006.01)
*H01J 37/02* (2006.01)
*H01J 37/305* (2006.01)
*H01L 21/687* (2006.01)

(52) U.S. Cl.
CPC .......... *H01J 37/3244* (2013.01); *H01J 37/02* (2013.01); *H01J 37/3056* (2013.01); *H01L 21/68764* (2013.01); *H01J 2237/006* (2013.01); *H01J 2237/20228* (2013.01)

(58) Field of Classification Search
USPC ...................................... 250/396 R, 427, 425
See application file for complete search history.

(56) References Cited

U.S. PATENT DOCUMENTS

| 4,714,834 A | 12/1987 | Shubaly |
| 8,147,648 B2 * | 4/2012 | Dhindsa ............. H01J 37/3244 118/723 E |
| 9,017,526 B2 * | 4/2015 | Singh ................ H01J 37/32422 156/345.1 |
| 9,865,433 B1 * | 1/2018 | Wallace ............ H01J 37/32449 |
| 2007/0273289 A1 | 11/2007 | Burtner et al. |

(Continued)

OTHER PUBLICATIONS

Shurong Liang, et al., Apparatus and Techniques to Treat Substrates Using Directional Plasma and Point of Use Chemistry, U.S. Appl. No. 14/808,612, filed Jul. 24, 2015.

(Continued)

*Primary Examiner* — Phillip A Johnston

(57) ABSTRACT

A gas injection system for an ion beam device, the gas injection system including an extraction plate, an extraction aperture formed in the extraction plate for allowing passage of an ion beam, a first gas distributor removably fastened to the extraction plate on a first side of the extraction aperture, the first gas distributor having a gas orifice formed therein, a second gas distributor removably fastened to the extraction plate on a second side of the extraction aperture opposite the first side, the second gas distributor having a gas orifice formed therein, a first gas conduit extending through the extraction plate between the first gas distributor and a gas manifold mounted to the extraction plate, and a second gas conduit extending through the extraction plate between the second gas distributor the gas manifold, and a residue removal gas source connected to the gas manifold.

10 Claims, 5 Drawing Sheets

(56) References Cited

U.S. PATENT DOCUMENTS

| | | |
|---|---|---|
| 2010/0084582 A1 | 4/2010 | Lischer et al. |
| 2011/0108058 A1 | 5/2011 | Srivastava et al. |
| 2012/0138472 A1 | 6/2012 | Han et al. |
| 2012/0175062 A1* | 7/2012 | de la Llera ....... H01J 37/32091 156/345.34 |
| 2014/0326897 A1 | 11/2014 | Kawanami et al. |
| 2017/0135194 A1 | 5/2017 | Belchenko et al. |

OTHER PUBLICATIONS

International Search Report and Written Opinion dated Nov. 14, 2016 in corresponding international patent application No. PCT/US2016/047236.

* cited by examiner

GAS INJECTION SYSTEM FOR ION BEAM DEVICE

FIELD OF THE DISCLOSURE

Embodiments of the present disclosure relate to the field of ion beam devices, and more particularly to an apparatus and method for injecting residue removal gases into a process chamber of an ion beam device.

BACKGROUND OF THE DISCLOSURE

In order to create desired surface features on a semiconductor wafer or other substrate, an ion beam of prescribed energy may be projected onto the surface of the substrate in a predetermined pattern to "etch" the desired features into the substrate. During this etching process, the substrate can be mechanically driven or "scanned" in a direction transverse to an ion beam projected onto the substrate by an ion source. For example, if an ion beam is projected along a horizontal plane toward a vertically-oriented substrate, the substrate may be scanned in a vertical direction and/or in a lateral direction perpendicular to the projected ion beam. Thus, the entire surface of the substrate can be exposed to the ion beam.

Etching a substrate with an ion beam creates residue in the form of sputtered atoms dislodged from the etched surface of the substrate and redeposited on another portion of the substrate. This residue can be detrimental to the quality of a finished substrate if not removed. In order to remove the residue, a substrate can be exposed to various "residue removal gases," such as methanol, ethanol, or isopropanol before, during, and/or after etching of the substrate. Such residue removal gases may react with atoms sputtered from an etched surface of a substrate to form volatile molecules. These volatile molecules can then be evacuated using vacuum pumps or the like.

Conventionally, residue removal gases are introduced into a process chamber of an ion beam device through a "shower head" structure located adjacent a substrate that is being processed. In order to provide sufficient clearance for the substrate and for components of the ion beam apparatus, the shower head is typically positioned some distance away from the substrate. Thus, the presence of the shower head necessitates a process chamber significantly larger than would otherwise be necessary. Additionally, since the shower head is positioned a significant distance away from a substrate, the residue removal gases emitted by the shower head diffuse throughout much of the process chamber before drifting into contact with the substrate. Much of the residue removal gases are removed from the process chamber before reaching the surface of the substrate, resulting in inefficient and ineffective delivery of the residue removal gases.

With respect to these and other considerations the present improvements may be useful.

SUMMARY

This Summary is provided to introduce a selection of concepts in a simplified form. This Summary is not intended to identify key features or essential features of the claimed subject matter, nor is this Summary intended as an aid in determining the scope of the claimed subject matter.

An exemplary embodiment of an gas injection system for an ion beam device in accordance with the present disclosure may include an extraction plate, an extraction aperture formed in the extraction plate for allowing passage of an ion beam through the extraction plate, and a gas distributor removably fastened to the extraction plate, the gas distributor having a gas orifice formed therein.

Another exemplary embodiment of a gas injection system for an ion beam device in accordance with the present disclosure may include an extraction plate, an extraction aperture formed in the extraction plate for allowing passage of an ion beam through the extraction plate, a first gas distributor removably fastened to the extraction plate on a first side of the extraction aperture, the first gas distributor having a gas orifice formed therein, a second gas distributor removably fastened to the extraction plate on a second side of the extraction aperture opposite the first side, the second gas distributor having a gas orifice formed therein, a first gas conduit extending through the extraction plate between the first gas distributor and a gas manifold mounted to the extraction plate, and a second gas conduit extending through the extraction plate between the second gas distributor the gas manifold, and a gas source connected in fluid communication with the gas manifold, the gas source containing a residue removal gas.

An exemplary embodiment of a method for applying a residue removal gas to a substrate in accordance with an embodiment of the present disclosure may include scanning the substrate in front of an extraction plate of an ion beam device, supplying the residue removal gas to the extraction plate from a gas source, and emitting the residue removal gas from a gas orifice in a gas distributor removably mounted to the extraction plate.

BRIEF DESCRIPTION OF THE DRAWINGS

By way of example, various embodiments of the disclosed apparatus will now be described, with reference to the accompanying drawings, wherein.

DETAILED DESCRIPTION

Figure 1:
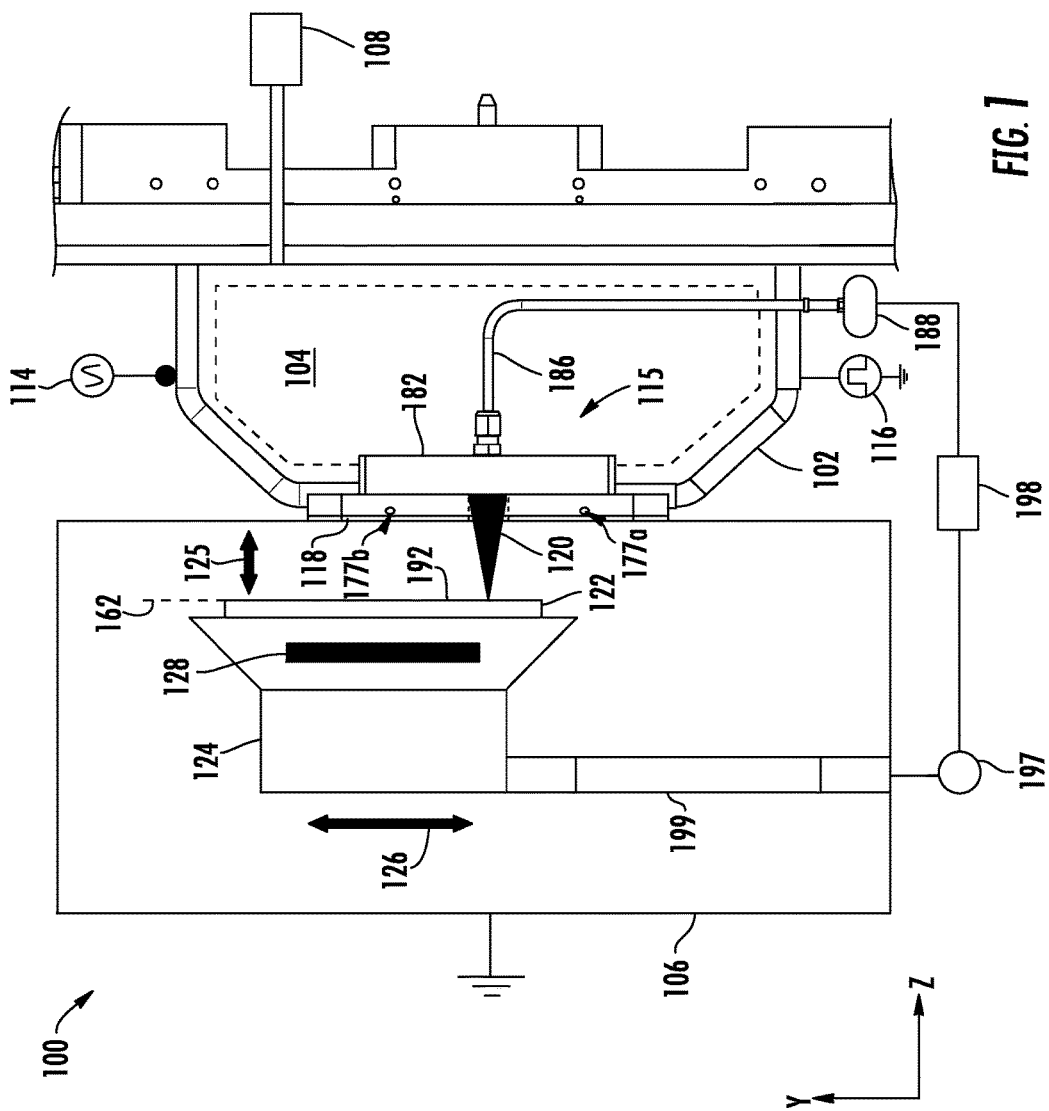
FIG. 1 is side cross-sectional view illustrating an exemplary embodiment of an ion beam device in accordance with the present disclosure.

The present embodiments will now be described more fully hereinafter with reference to the accompanying drawings, wherein some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

The present embodiments provide a novel system and method for treating substrates, and in particular a novel system and method for treating a substrate surface, such as to remove etched residual material from a substrate surface. In particular embodiments, an extraction plate having integrated gas distributors for emitting one or more residue removal gases in close proximity to a substrate surface before, during, and/or after etching of the surface is disclosed.

FIG. 1 depicts an ion beam device 100 (hereinafter "the device 100") according to an exemplary embodiment of the present disclosure. The device 100 may include a plasma chamber 102. The plasma chamber 102 may house a plasma 104 as illustrated. The device 100 further may further include a process chamber 106. The device 100 may include at least one gas source 108 to provide a working gas (described below) to the plasma chamber 102. The device 100 may further include a power source, shown as the plasma power source 114, to generate power to ignite and sustain the plasma 104. The plasma power source 114 may be an RF power source, inductively-coupled plasma (ICP) source, capacitively coupled plasma (CCP) source, helicon source, electron cyclotron resonance (ECR) source, indirectly heated cathode (IHC) source, glow discharge source, or other plasma sources known to those skilled in the art. The device 100 may further include a gas injection system 115 for introducing a residue removal gas into the process chamber 106 as further described below. The device 100 may further include a bias supply 116 coupled to the plasma chamber 102.

The bias supply 116 may be configured to generate a voltage difference between the plasma chamber 102 and a substrate stage 124 disposed in the process chamber 106. In the embodiment of FIG. 1, the bias supply 116 may bias the plasma chamber 102 positively with respect to ground potential, while the process chamber 106 as well as substrate stage 124 are held at ground potential. When the plasma 104 is present in the plasma chamber 102, and the bias supply 116 biases the plasma chamber 102 positively with respect to ground potential, an ion beam 120 comprising positive ions may be extracted from the plasma 104. In other embodiments of the device 100, the plasma chamber 102 may be held at ground potential and the substrate 122 and substrate stage 124 may be biased positively with respect to ground potential.

The ion beam 120 may be extracted through an extraction plate 118, and may be directed into the process chamber 106 to a substrate 122 held on the substrate stage 124. In various embodiments, the substrate stage 124 may be movable with respect to the extraction plate 118. For example, the substrate stage 124 may be movable in a direction parallel to the Z-axis of the Cartesian coordinate system shown as indicated by arrow 125. In this manner, a distance between the surface of the substrate 122 and extraction plate 118 may be varied. In various embodiments, the substrate stage 124 may be configured to scan the substrate 122 relative to the extraction plate 118 in a direction parallel to the plane 162 of the substrate 122. For example, as shown in FIG. 1, the substrate stage 124 may be vertically movable parallel to the Y-axis as indicated by arrow 126. As further shown in FIG. 1, the substrate stage 124 may include a heater 128 for heating the substrate 122.

In accordance with various embodiments of the present disclosure, the gas source 108 of the device 100 may supply one more feed gases to the plasma chamber 102 for use in generating the plasma 104. Such feed gases may include neon gas, xenon gas, and argon gas. Ion beams extracted from plasma formed from one or more of the aforementioned noble gases have been found to be effective for etching various substrate materials, including silicon.

Figure 2:
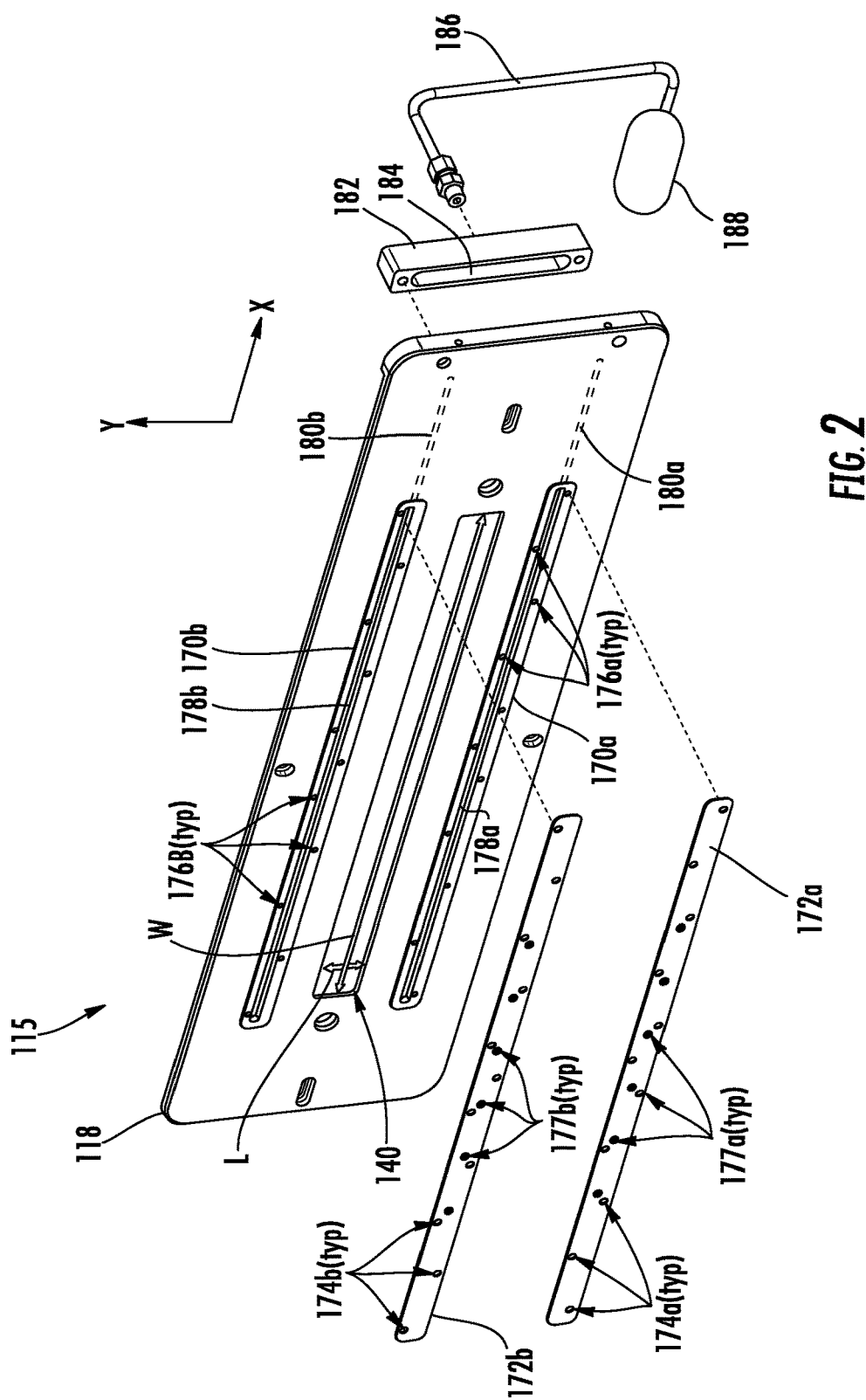
FIG. 2 is an exploded perspective view illustrating an exemplary embodiment of a gas injection system in accordance with the present disclosure.

Referring to FIG. 2, an exploded view illustrating the exemplary gas injection system 115 of the device 100 is shown. The gas injection system 115 may include an extraction plate 118 having an extraction aperture 140 formed therethrough for allowing passage of the ion beam 120 (FIG. 1). The extraction aperture 140 may have a width W along the X-axis and a length L along the Y-axis, where W is greater than L. In some examples, W may have a value in the range of 150 mm to 300 mm or greater, while L may have a value in the range of 3 mm to 30 mm. The embodiments of the present disclosure are not limited in this context. Thus, the ion beam 120 (FIG. 1) may be extracted through the extraction aperture 140 as a ribbon beam having a beam width greater than a beam length.

The extraction plate 118 may be provided with first and second elongated cavities or recesses 170a, 170b formed in the front surface 174 of the extraction plate 118 on opposing sides of the extraction aperture 140 (e.g., above and below the extraction aperture 140 as shown in FIG. 2). The first and second recesses 170a, 170b may be adapted to receive respective first and second gas distributors 172a, 172b having sizes and shapes similar to those of the first and second recesses 170a, 170b. The first and second gas distributors 172a, 172b may fit within the first and second recesses 170a, 170b, respectively, in close-clearance, mating engagement therewith and may be removably fastened to the extraction plate 118 by mechanical fasteners (not shown) extending through respective pairs of mounting holes 174a, 174b and 176a, 176b formed in the first and second gas distributors 172a, 172b and in the first and second recesses 170a, 170b. The first and second gas distributors 172a, 172b may be provided with respective first and second pluralities of gas orifices 177a, 177b for emitting one or more residue removal gases into the process chamber 106 (FIG. 1) as further described below.

The first and second recesses 170a, 170b may be provided with respective first and second elongated gas outlet channels 178a, 178b formed therein. The first and second gas outlet channels 178a, 178b may be connected in fluid communication with respective first and second gas conduits 180a, 180b extending through the interior of the extraction plate 118. A gas manifold 182 may be mounted to a rear of the extraction plate and may have an outlet 184 that is in fluid commination with the first and second gas conduits 180a, 180b. A gas supply line 186 may be connected to the gas manifold 182 for supplying a residue removal gas (described below) to the gas manifold 182 from a pressurized gas source 188. Some or all of the various junctures described above, including the junctures of the first and second gas distributors 172a, 172b and their respective first and second recesses 170a, 170b, the junctures of the first and second gas conduits 180a, 180b and the gas manifold 182, and the juncture of the gas manifold 182 and the gas supply line 186, may be provided with various seals or sealing arrangements (not shown) for providing fluid-tight connections.

The gas source 188 may contain one or more residue removal gases selected for their ability to react with sputtered atoms from the etched surface 192 of the substrate 122 (FIG. 1) to form volatile molecules for subsequent removal from the process chamber 106 of the device 100 (FIG. 1). Such residue removal gases may include, and are not limited to, methanol, ethanol, isopropanol, acetone, carbon monoxide, carbon dioxide, ammonia, nitrous oxide, ethylene glycol, chlorine, fluorine, nitrogen trifluoride, and hydrogen cyanide.

Embodiments of the gas injection system 115 are contemplated wherein the extraction plate 118 is provided with a greater or fewer number of gas distributors (and respective recesses and gas conduits) than described above. For example, one of the first and second gas distributors 172a, 172b of the extraction plate 118 may be omitted. In other embodiments, the extraction plate 118 may include a plurality of gas distributors located above and/or below the extraction aperture 140. In other embodiments, the extraction plate 118 may include one or more gas distributors located horizontally adjacent the extraction aperture 140. In other embodiments, the gas distributers 172a, 172b may be formed as integral, contiguous, non-removable parts of the extraction plate 118.

Further embodiments of the gas injection system 115 are contemplated wherein the first and second recesses 170a, 170b are formed in the rear surface (not within view) of the extraction plate 118, and wherein the first and second gas distributors 172a, 172b are disposed and fastened within such first and second recesses 170a, 170b in the rear of the extraction plate 118, thus exposing a substrate disposed adjacent the front of the extraction plate 118 to fewer hardware components (e.g., mechanical fasteners) and thus fewer contaminants generated by such hardware components relative to the embodiment depicted in FIG. 2.

During operation of the device 100, such as for etching a substrate 122 disposed on the substrate stage 124 as shown in FIG. 1, the substrate stage 124 may be scanned relative to the extraction plate 118 in the manner described above. For example, the substrate stage 124 may be scanned vertically relative to the extraction plate 118 in order to expose the substrate 122 to the ion beam 120 projected through the extraction aperture 140. As the substrate stage 124 is scanned thusly, residue removal gas supplied by the gas source 188 may be controllably fed through the gas supply line 186 and the gas manifold 182 to the first and second gas conduits 180a, 180b (FIG. 2) of the extraction plate 118. The residue removal gas may then flow through the first and second gas conduits 180a, 180b to the first and second gas outlet channels 178a, 178b in the first and second recesses 170a, 170b (FIG. 2), whereafter the residue removal gas may pass through, and may be emitted from, the gas orifices 177a, 177b of the first and second gas distributors 172a, 172b. Thus, the residue removal gas may be sprayed directly onto the moving surface 192 of the substrate 122, with the surface 192 being positioned in close proximity (e.g., 5-25 millimeters) to the gas orifices 177a, 177b as the residue removal gas is applied thereto.

Owning to the relatively short distance between the gas orifices 177a, 177b and the surface 192 of the substrate 122, the gas injection system 115 may apply residue removal gas to the surface 192 at a lower flow rate and at a higher pressure relative to conventional shower head gas delivery systems, wherein residue removal gas is introduced into a process chamber at a significant distance (e.g., 25-200 millimeters) from a substrate and is allowed to diffuse throughout the process chamber before passively settling onto a surface of the substrate. Thus, the residue removal gas emitted from the gas orifices 177a, 177b of the gas injection system 115 is relatively concentrated and undiffused when received by the surface 192, resulting in higher surface coverage and a higher gas-surface collision rate, and thus providing a more effective and more efficient application of residue removal gas relative to conventional shower head gas delivery systems. Thus, the total amount of residue removal gas necessary for processing a substrate may be reduced while the efficacy of the residue removal gas is enhanced relative to conventional shower head gas delivery systems.

Additionally, since there is no need for a separate shower head structure in the process chamber 106, the process chamber 106 may be made smaller, and the device 100 may thus have a smaller form factor, than ion beam devices employing conventional shower head gas delivery systems. Still further, since the residue removal gas is emitted from the gas orifices 177a, 177b in the form of concentrated jets directly onto the surface 192 of the substrate 122, the residue removal gas may be applied to the surface 192 in a precise, targeted manner before, during, and/or after etching of the substrate 122. In one example, the residue removal gas may be emitted from the gas orifices 177a of the first gas distributor 172a in the form of individual jets that may, before coming into contact with the surface 192, diffuse slightly and overlap with one another to collectively form a single blade or ribbon of residue removal gas emitted from below the extraction aperture 140. The gas orifices 177b in the second gas distributor 172b may emit residue removal gas in a similar manner to form a blade or ribbon of residue removal gas emitted from above the extraction aperture 140. Thus, if the substrate stage 124 scans the substrate 122 vertically upwardly during an etching process, starting with the substrate 122 positioned below the extraction aperture 140, the residue removal gas emitted from the gas orifices 177a in the first gas distributor 172a may be applied to the surface 192 of the substrate 122 before the surface 192 is exposed to the ion beam 120, and the residue removal gas emitted from the gas orifices 177b in the second gas distributor 172a may be applied to the surface 192 of the substrate 122 after the surface 192 is exposed to the ion beam 120.

Figure 3:
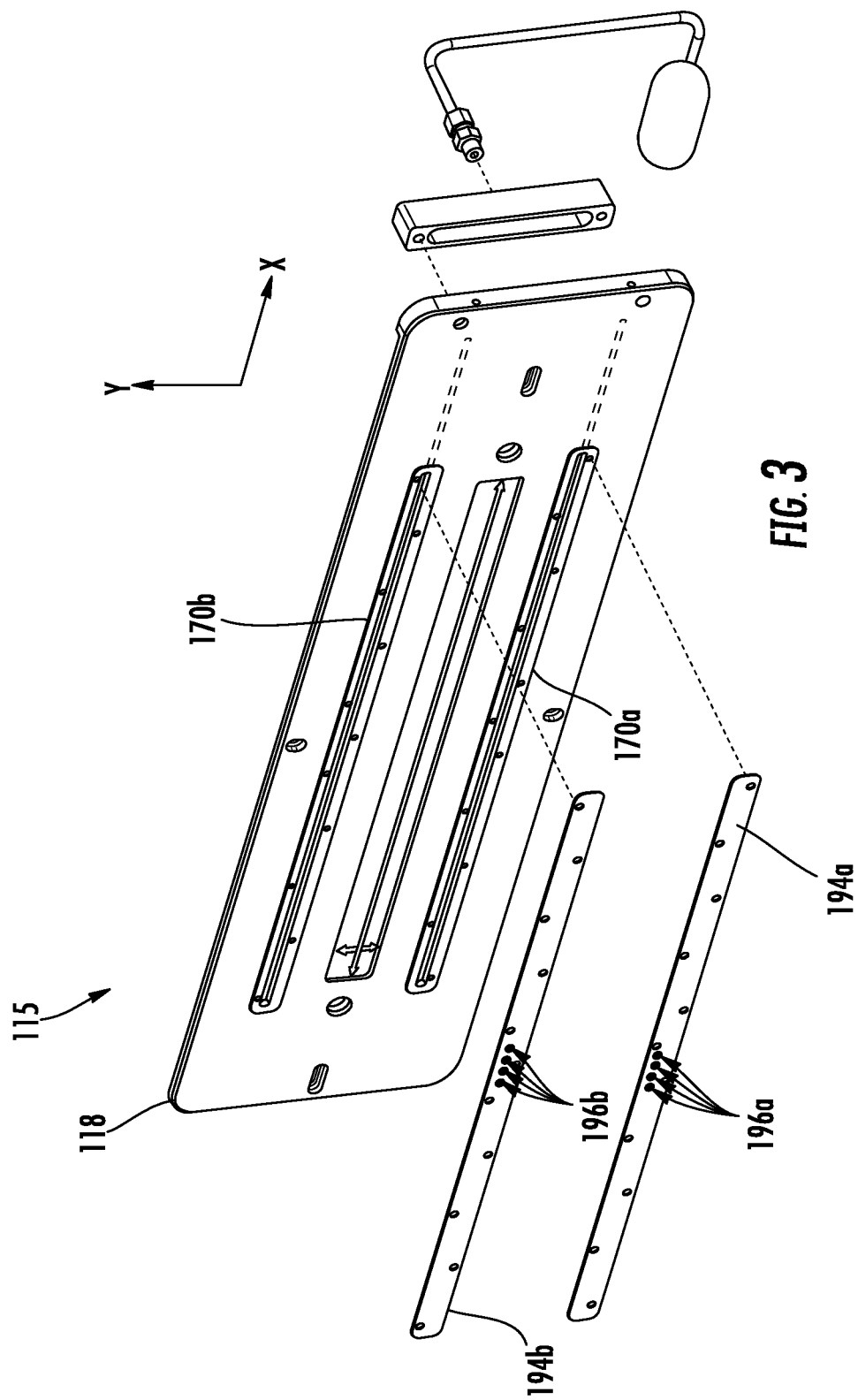
FIG. 3 is an exploded perspective view illustrating an alternative embodiment of a gas injection system in accordance with the present disclosure.

The first and second gas distributors 172a, 172b may be conveniently removed from their respective first and second recesses 170a, 170b in the extraction plate 118 (e.g., via removal of mechanical fasteners) to facilitate the installation of alternative gas distributors having gas orifices with shapes, sizes, and/or configurations different than those of the gas orifices 177a, 177b of the first and second gas distributors 172a, 172b. For example, referring to FIG. 3, first and second gas distributors 194a, 194b having respective first and second pluralities of gas orifices 196a, 196b may be installed in the first and second recesses 170a, 170b of the extraction plate 118, wherein the gas orifices 196a, 196b are more tightly-spaced and are located nearer the longitudinal centers of the first and second gas distributors 194a, 194b relative to the gas orifices 177a, 177b of the first and second gas distributors 172a, 172b (FIG. 2), wherein the gas orifices 177a, 177b are relatively more widely-spaced and are spread relatively further across the first and second gas distributors 172a, 172b. In another example, some or all of the gas orifices 196a, 196b may be elongated slots. Such alternative configurations of gas orifices may be beneficial in various circumstances where the targeted application of residue removal gas to specific areas of a substrate is desired.

Referring again to FIG. 1, the device 100 may include a controller 198 operatively connected to the gas source 180 for controlling the delivery of residue removal gas to the extraction plate 118 in a predetermined (e.g., preprogrammed) manner. For example, the controller 198 may be operatively connected to a drive mechanism 197 that drives the substrate stage 124 (via support arm 199) during scanning of the substrate 122, and the controller 198 may be programmed to coordinate the delivery of residue removal gas to the extraction plate 118, and thus the emission of residue removal gas from the gas orifices 177a, 177b, with the position and movement of the substrate stage 124 to deliver the residue removal gas to the substrate 122 in a desired manner. In one example, the controller 198 may control a rate of the residue removal gas delivered to the extraction plate 118 for varying the pressure of the residue removal gas emitted from the gas orifices 177a, 177b.

Figure 4:
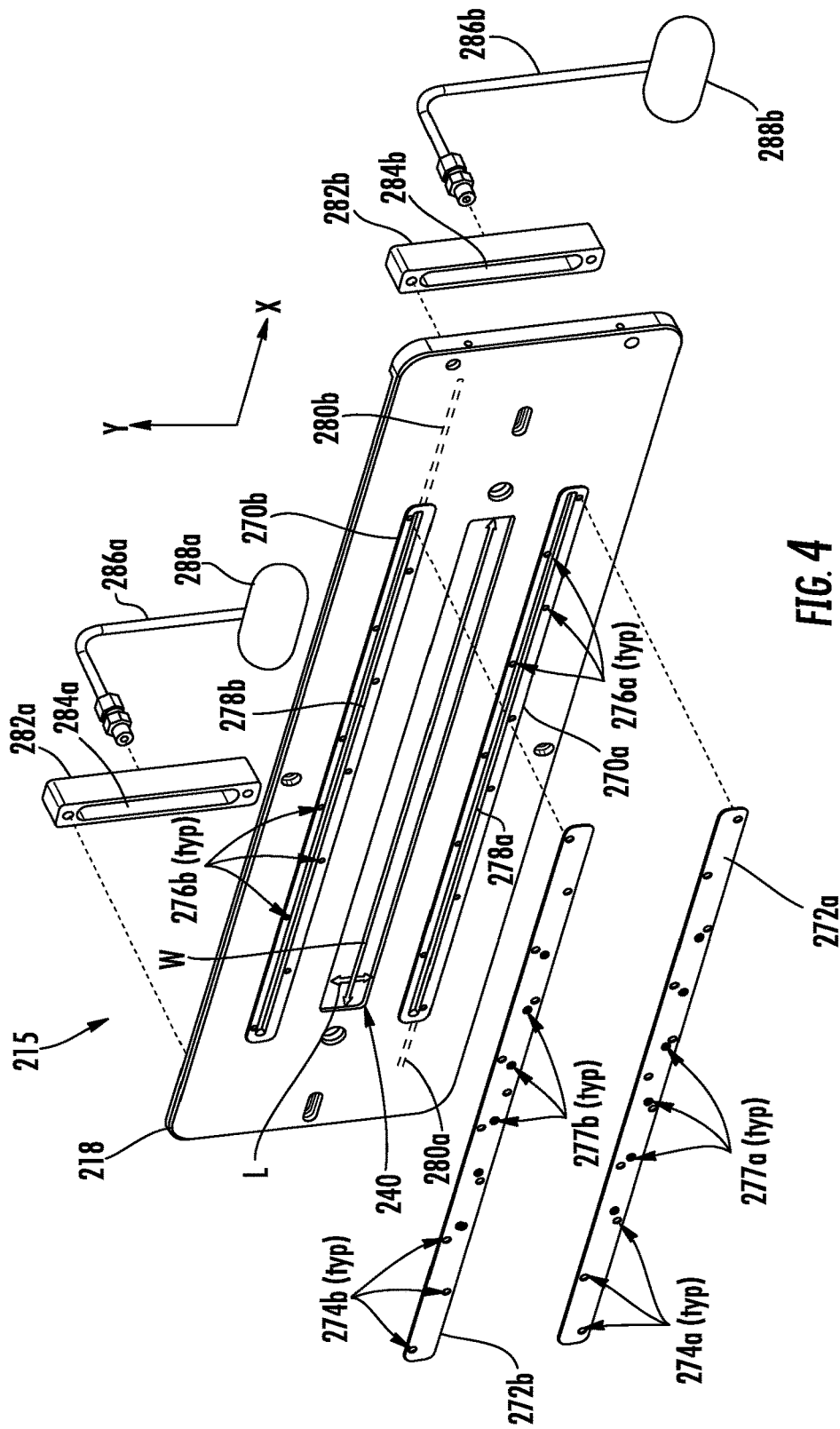
FIG. 4 is an exploded perspective view illustrating an exemplary embodiment of another alternative gas injection system in accordance with the present disclosure.

Referring to FIG. 4, an exploded view illustrating an exemplary alternative gas injection system 215 in accordance with an embodiment of the present disclosure is shown. The gas injection system 215 may be similar to the gas injection system 115 described above, and may be implemented in the device 100 (FIG. 1) in lieu of the gas injection system 115. The gas injection system 215 may be adapted to controllably emit two different residue removal gases into the process chamber 106, wherein such residue removal gases may be emitted separately and independently of one another as will be described in greater detail below.

The gas injection system 215 may include an extraction plate 218 having an extraction aperture 240 formed therethrough for allowing passage of an ion beam. The extraction aperture 240 may have a width W along the X-axis and a length L along the Y-axis, where W is greater than L. In some examples, W may have a value in the range of 150 mm to 300 mm or greater, while L may have a value in the range of 3 mm to 30 mm. The embodiments of the present disclosure are not limited in this context. Thus, an ion beam may be extracted through the extraction aperture 240 as a ribbon beam having a beam width greater than a beam length.

The extraction plate 218 may be provided with first and second elongated cavities or recesses 270a, 270b formed in the front surface 274 thereof on opposing sides of the extraction aperture 240 (e.g., above and below the extraction aperture 240 as shown in FIG. 4). The first and second recesses 270a, 270b may be adapted to receive respective first and second gas distributors 272a, 272b having sizes and shapes similar to those of the recesses 270a, 270b. The first and second gas distributors 272a, 272b may fit within the first and second recesses 270a, 270b, respectively, in close-clearance, mating engagement therewith and may be removably fastened to the extraction plate 218 by mechanical fasteners (not shown) extending through respective pairs of mounting holes 274a, 274b and 276a, 276b formed in the first and second gas distributors 272a, 272b and in the first and second recesses 270a, 270b. The first and second gas distributors 272a, 272b may be provided with respective first and second pluralities of gas orifices 277a, 277b for emitting one or more residue removal gases into a process chamber as further described below.

The first and second recesses 270a, 270b may be provided with respective elongated first and second gas outlet channels 278a, 278b formed therein. The first gas outlet channel 278a may be connected in fluid communication with a first gas conduit 280a extending through the interior of the extraction plate 218. A first gas manifold 282a may be mounted to a rear of the extraction plate 218 and may have a first outlet 284a that is in fluid commination with the first gas conduit 280a. A first gas supply line 286a may be connected to the first gas manifold 282a for supplying a first residue removal gas to the first gas manifold 282a from a first pressurized gas source 288a. Similarly, the second gas outlet channel 278b may be connected in fluid communication with a second gas conduit 280b extending through the interior of the extraction plate 218. A second gas manifold 282b may be mounted to a rear of the extraction plate 218 and may have a second outlet 284b that is in fluid commination with the second gas conduit 280b. A second gas supply line 286b may be connected to the second gas manifold 282b for supplying a second residue removal gas to the second gas manifold 282b from a second pressurized gas source 288b.

Some or all of the various junctures described above, including the junctures of the first and second gas distributors 272a, 272b and their respective first and second recesses 270a, 270b, the junctures of the first and second gas conduits 280a, 280b and the first and second gas manifolds 282a, 282b, and the junctures of the first and second gas manifold 282a, 282b and the first and second gas supply lines 286a, 286b, may be provided with various seals or sealing arrangements (not shown) for providing fluid-tight connections.

The first gas source 288a may contain a first residue removal gas selected for its ability to react with sputtered atoms from an etched surface of a substrate to form volatile molecules for subsequent removal from a process chamber. Such residue removal gases may include, but are not limited to, methanol, ethanol, isopropanol, acetone, carbon monoxide, carbon dioxide, ammonia, nitrous oxide, ethylene glycol, chlorine, fluorine, nitrogen trifluoride, and hydrogen cyanide. The second gas source 288b may contain a second residue removal gas identical to, or different from, the residue removal gas contained in the first gas source 288a.

The gas injection system 215 may be employed to apply the first residue removal gas to a substrate at a first point during processing (e.g., etching) of the substrate and to apply the second residue removal gas to the substrate at second point during processing. For example, if a substrate disposed in front of the extraction plate 218 is scanned vertically upwardly during an etching process, starting with the substrate positioned below the extraction aperture 240, the first residue removal gas emitted from the gas orifices 277a in the first gas distributor 272a may be applied to a surface of the substrate before the surface is exposed to an ion beam extracted through the extraction aperture 240, and the second residue removal gas emitted from the gas orifices 277b in the second gas distributor 272b may be applied to the surface of the substrate after the surface is exposed to the ion beam. In one example, wherein the gas injection system 115 is substituted for the gas injection system 115 in the device 100 (FIG. 1), the first gas source 288a and the second gas source 288b may be operatively connected to the controller 198, and the above-described application of the first residue removal gas and the second residue removal gas to a substrate at different points during processing of the substrate may be executed by the controller 198 in a predetermined (e.g., preprogrammed) manner in coordination with movement of the substrate stage 124 by the drive mechanism 197.

Figure 5:
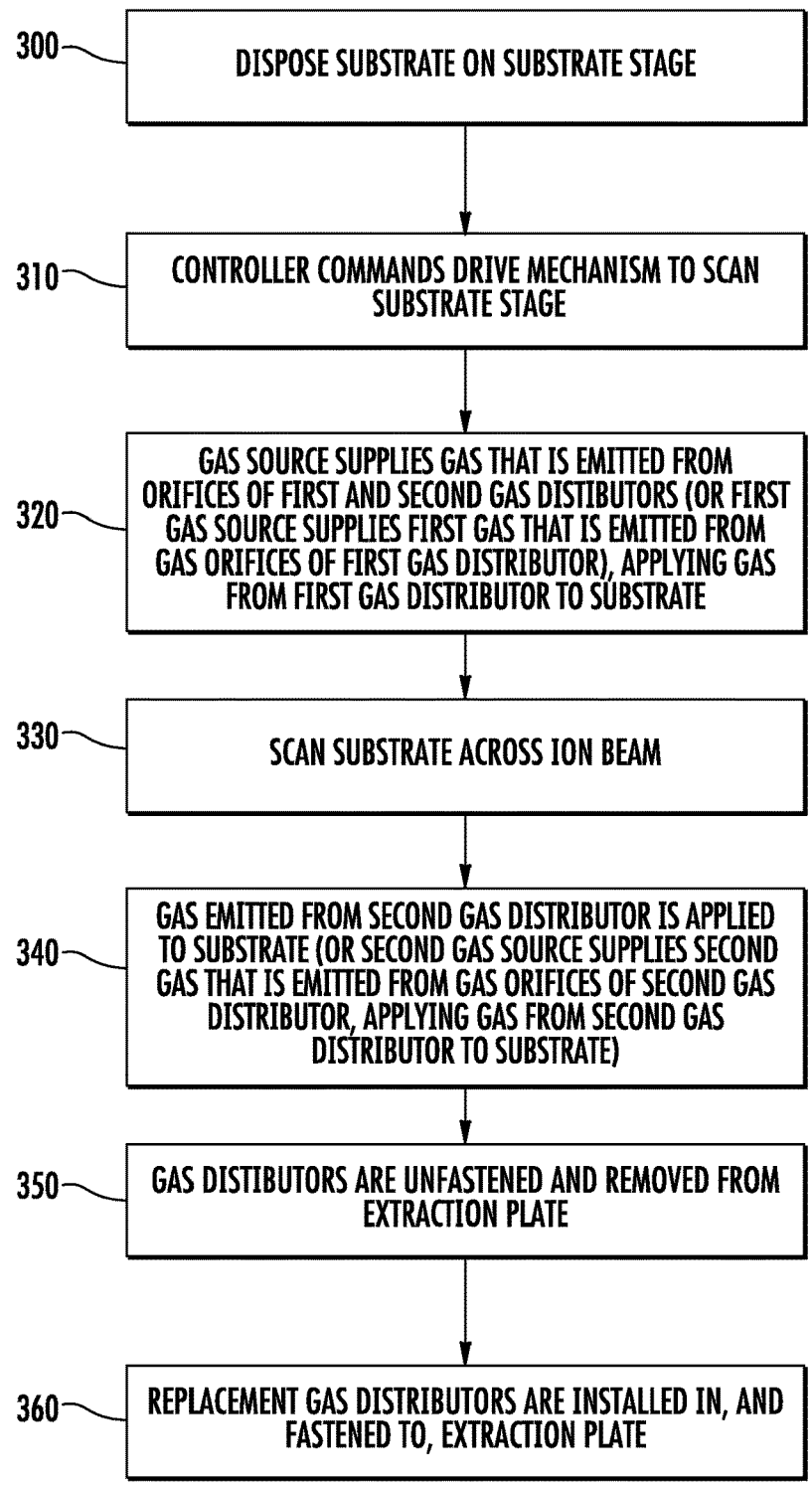
FIG. 5 is a flow diagram illustrating an exemplary method for employing the ion beam device and gas injection systems of the present disclosure to apply residue removal gases to a substrate.

Referring to FIG. 5, a flow diagram illustrating an exemplary method in accordance with an embodiment of the present disclosure is shown. In particular, the method is directed toward using the device 100 (FIG. 1) to apply one or more residue removal gases to a substrate before, during, and/or after etching of the substrate, wherein such application is performed in a more effective and efficient manner relative to what has been previously achieved using conventional shower head gas delivery systems. The method will now be described in detail with reference to the device 100 and the extraction plates 118, 218 shown in FIGS. 1-4.

At block 300 of the exemplary method illustrated in FIG. 5, the substrate 122 may be disposed on the substrate stage 124, with the surface 192 of the substrate 122 oriented parallel to the extraction plate 118 and with a top edge of the substrate 122 positioned vertically below the first gas distributor along the Y-axis shown in FIG. 1. At block 310 of the method, the controller 198 may commend the drive mechanism 197 to begin scanning the substrate stage 124 and the substrate 122 vertically upwardly (via the support arm 199).

When the substrate 122 is scanned in front of the first gas distributor 172a, the controller 198 may, at block 320 of the exemplary method illustrated in FIG. 5, command the gas source 188 to begin supplying a residue removal gas to the extraction plate 118 in the manner described above, causing the residue removal gas to be emitted from the gas orifices 177a, 177b of the first and second gas distributors 172a, 172b. Thus, the residue removal gas emitted from the gas orifices 177a of the first gas distributor 172a may be applied to the surface 192 of the substrate 122 before the surface 192 is etched by the ion beam 120, with the surface 192 disposed in close proximity (e.g., 5-25 millimeters) to the gas orifices 177a. Alternatively, if the gas injection system 215 (FIG. 4) has been substituted for the gas injection system 115 in the device 100, the controller 198 may, at block 320 of the exemplary method illustrated in FIG. 5, command the first gas source 288a to begin supplying a first residue removal gas to the extraction plate 218 in the manner described above, causing the first residue removal gas to be emitted from the gas orifices 277a of the first gas distributor 272a. Thus, the first residue removal gas emitted from the gas orifices 277a of the first gas distributor 272a may be applied to the surface 192 of the substrate 122 before the surface 192 is etched by the ion beam 120, with the surface 192 disposed in close proximity (e.g., 5-25 millimeters) to the gas orifices 277a.

At block 330 of the exemplary method illustrated in FIG. 5, the drive mechanism 197 may continue to scan the substrate stage 124 vertically upwardly, with the surface 192 of the substrate 122 passing over the ion beam 120 and with desired portions of the surface 192 being etched by the ion beam 120. When the substrate 122 is scanned in front of the second gas distributor 172b, the residue removal gas emitted from the gas orifices 177b of the second gas distributor 172b may, at block 340 of the exemplary method, be applied to the surface 192 of the substrate 122, with the surface 192 disposed in close proximity (e.g., 5-25 millimeters) to the gas orifices 177b. Thus, the residue removal gas may be applied to the surface 192 of the substrate 122 after the surface 192 has been etched by the ion beam 120. Alternatively, if the gas injection system 215 (FIG. 4) has been substituted for the gas injection system 115 in the device 100, the controller 198 may, at block 340 of the exemplary method illustrated in FIG. 5, command the second gas source to begin supplying a second residue removal gas to the extraction plate 218 in the manner described above when the substrate 122 is scanned in front of the second gas distributor 272b, wherein the second residue removal gas may be the same as, or may be different from, the first residue removal gas. Thus, the second residue removal gas may be emitted from the gas orifices 277b of the second gas distributor 272b and may be applied to the surface 192 of the substrate 122 after the surface 192 has been etched by the ion beam 120, with the surface 192 disposed in close proximity (e.g., 5-25 millimeters) to the gas orifices 277b.

In order to modify the extraction plate 118 for use in a subsequent etching application (i.e., subsequent to the application described above and set forth in blocks 300-340 in FIG. 5), the first and second gas distributors 172a, 172b of the extraction plate 118 may, at block 350 of the exemplary method illustrated in FIG. 5, be removed from the extraction plate 118, such as by removing a plurality of mechanical fasteners that fasten the first and second gas distributors 172a, 172b the extraction plate 118. At block 360 of the exemplary method, a pair of replacement gas distributors (FIG. 2) having gas orifices 196a, 196b configured differently than those of the gas distributors 172a, 172b may be installed in the extraction plate 118.

Thus, the above-described device 100 and corresponding method for introducing residue removal gases into a process chamber may provide numerous advantages relative to ion beam processing systems employing conventional shower head gas delivery systems for introducing residue removal gases into a process chamber. For example, one such advantage is that, owning to the relatively short distance between the gas orifices 177a, 177b and the surface of a substrate being processed, the gas injection system 115 may apply residue removal gas to the surface 192 at a lower flow rate and at a higher pressure relative to conventional shower head gas delivery systems. Thus, the residue removal gas emitted from the gas orifices 177a, 177b of the gas injection system 115 is relatively concentrated and undiffused when received by the substrate surface, resulting in a more effective and more efficient application of residue removal gas relative to conventional shower head gas delivery systems. Thus, the total amount of residue removal gas necessary for processing a substrate may be reduced while the efficacy of the residue removal gas is enhanced relative to conventional shower head gas delivery systems. A further advantage conferred by the gas injection system 115 is that, since there is no need for a separate shower head structure in the process chamber 106 of the device 100, the process chamber 106 may be made smaller, and the device 100 may thus have a smaller form factor than ion beam devices employing conventional shower head gas delivery systems. A further advantage conferred by the gas injection system 115 is that, since residue removal gas is emitted from the gas orifices 177a, 177b in the form of concentrated jets directly onto the surface of a substrate, the residue removal gas may be applied to the surface in a precise, targeted manner before and/or after etching of the substrate. A further advantage conferred by the gas injection system 115 is that, since the first and second gas distributors 172a, 172b are fastened to the extraction plate 118 by removable mechanical fasteners, the first and second gas distributors 172a, 172b may be conveniently removed from the extraction plate 118 and substitute first and second gas distributors having gas orifices with shapes, sizes, and or configurations different than those of the first and second gas distributors 172a, 172b may be installed in the extraction plate 118 to better suit a particular application. A further advantage conferred by the gas injection system 215 is that a first residue removal gas may be applied to a substrate surface immediately before processing and a second residue removal gas may be applied to the substrate surface immediately after processing.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, while the present disclosure has been described herein in the context of a particular implementation in a particular environment for a particular purpose, those of ordinary skill in the art will recognize its usefulness is not limited thereto. Embodiments of the present disclosure may be beneficially implemented in any number of environments for any number of purposes. Accordingly, the claims set forth below must be construed in view of the full breadth and spirit of the present disclosure as described herein.

The invention claimed is:

1. A gas injection system for an ion beam device, the gas injection system comprising:
    an extraction plate having an aperture for allowing passage of an ion beam through the extraction plate; and
    a gas distributor disposed within a recess formed in the extraction plate and removably coupled to the extraction plate, the gas distributor having a gas orifice formed therein;
    the extraction plate having a gas conduit extending through an interior thereof, the gas conduit in fluid communication with the recess for supplying gas to the recess.

2. The gas injection system of claim 1, wherein the gas conduit extends between the recess and a gas manifold mounted to the extraction plate.

3. The gas injection system of claim 2, further comprising a gas source connected in fluid communication with the gas manifold, the gas source containing a residue removal gas.

4. The gas injection system of claim 1, wherein the gas distributor is a first gas distributor, and wherein the extraction plate further comprises a second gas distributor, the second gas distributor having a gas orifice formed therein.

5. The gas injection system of claim 4, wherein the first gas distributor is located on a first side of the extraction aperture and the second gas distributor is located on a second side of the extraction aperture opposite the first side.

6. The gas injection system of claim 5, further comprising a first gas conduit extending through the extraction plate between the first gas distributor and a gas manifold mounted to the extraction plate, and a second gas conduit extending through the extraction plate between the second gas distributor and the gas manifold.

7. The gas injection system of claim 6, further comprising a gas source connected in fluid communication with the gas manifold, the gas source containing a residue removal gas.

8. The gas injection system of claim 5, further comprising a first gas conduit extending through the extraction plate between the first gas distributor and a first gas manifold mounted to the extraction plate, and a second gas conduit extending through the extraction plate between the second gas distributor and a second gas manifold mounted to the extraction plate.

9. The gas injection system of claim 8, further comprising a first gas source connected in fluid communication with the first gas manifold, the first gas source containing a first residue removal gas, and a second gas source connected in fluid communication with the second gas manifold, the second gas source containing a second residue removal gas.

10. A gas injection system for an ion beam device, the gas injection system comprising:
    an extraction plate having an extraction aperture for allowing passage of an ion beam through the extraction plate;
    a first gas distributor disposed within a first recess formed in the extraction plate and removably fastened to the extraction plate on a first side of the extraction aperture, the first gas distributor having a gas orifice formed therein;
    a second gas distributor disposed within a second recess formed in the extraction plate and removably fastened to the extraction plate on a second side of the extraction aperture opposite the first side, the second gas distributor having a gas orifice formed therein;
    a first gas conduit extending through the extraction plate between the first gas distributor and a gas manifold mounted to the extraction plate, and a second gas conduit extending through the extraction plate between the second gas distributor the gas manifold; and
    a gas source connected in fluid communication with the gas manifold, the gas source containing a residue removal gas.

* * * * *